United States Patent
Fitzgerald et al.

(10) Patent No.: US 8,169,193 B2
(45) Date of Patent: May 1, 2012

(54) CHARGE INJECTION DISCHARGE CIRCUIT

(75) Inventors: Padraig Liam Fitzgerald, Co. Cork (IE); Nigel James Hayes, Clonakilty (IE)

(73) Assignee: Analog Devices, Inc., Norwood, MA (US)

( * ) Notice: Subject to any disclaimer, the term of this patent is extended or adjusted under 35 U.S.C. 154(b) by 1057 days.

(21) Appl. No.: 12/099,932

(22) Filed: Apr. 9, 2008

(65) Prior Publication Data

US 2009/0256531 A1 Oct. 15, 2009

(51) Int. Cl.
*H02J 7/04* (2006.01)

(52) U.S. Cl. .................................. 320/141; 320/145

(58) Field of Classification Search .......... 320/141, 320/139, 145
See application file for complete search history.

(56) References Cited

U.S. PATENT DOCUMENTS

| | | | |
|---|---|---|---|
| 5,952,849 A | 9/1999 | Haigh | |
| 6,873,065 B2 | 3/2005 | Haigh et al. | |
| 7,075,329 B2 | 7/2006 | Chen et al. | |
| 2005/0225300 A1* | 10/2005 | Nordlof | 320/141 |
| 2007/0009202 A1* | 1/2007 | Chan et al. | 385/18 |
| 2007/0285854 A1* | 12/2007 | Rodgers et al. | 361/56 |
| 2008/0074814 A1* | 3/2008 | Bhattacharya et al. | 361/56 |
| 2009/0009141 A1* | 1/2009 | Li | 320/141 |

OTHER PUBLICATIONS

Analog Devices, Inc., "Quad-Channel Digital Isolators," ADuM1410/ADuM1411/ADuM1412 Datasheet, Rev. G, pp. 1-24, Jun. 2007.

* cited by examiner

*Primary Examiner* — Roberto Velez
*Assistant Examiner* — Temilade S Rhodes-Vivour
(74) *Attorney, Agent, or Firm* — Kenyon & Kenyon LLP

(57) ABSTRACT

A circuit for dissipating injected parasitic charge includes a circuit stage, a pulse generating circuit and a switch. The circuit stage has an input node and an output node that injects a parasitic charge when switched OFF to the output node. The pulse generating circuit can generate a pulsed signal having an input for receiving a control signal. The control signal indicates the circuit stage is switching OFF, and has an output for outputting a pulsed signal in response to the control signal at the input. The pulsed signal can have a predetermined duration. The switch can be configured to be actuated by the pulsed signal output by the pulse generating circuit, and has a terminal connected to the output node of the circuit stage and a terminal connected to circuit to substantially dissipate the injected parasitic charge.

8 Claims, 3 Drawing Sheets

CHARGE INJECTION DISCHARGE CIRCUIT

BACKGROUND

The parasitic injection of charge onto an output terminal, for example, of a hold capacitor in a sample and hold circuit, can be problematic. Parasitic charge occurs when a complementary metal-oxide semiconductor (CMOS) transistor is switched off.

CMOS transistors comprise a source, a gate and a drain connections. The source and drain are formed using the same type of doping, either n or p. Generally, the gate is doped with a dopant opposite from the drain and the source. The doped region beneath the gate separates the drain from the source, and prevents current from flowing between the source and the drain. When voltage is applied to the gate, a channel is formed in the doped region beneath the gate, and current passes between the source and the drain through the channel i.e., the transistor is ON. When voltage is removed from the gate, the transistor is OFF However, the channel does not close instantly. As the transistor is turning OFF, a channel charge flows through the channel to the source or the drain. The amount of channel charge is a non-linear function of the voltage applied at the source of the transistor. This is called charge injection, and results in the problematic parasitic charge at the output terminal.

It is beneficial to prevent the parasitic charge from affecting the output on the output terminal of a device. Presently, compensation techniques for parasitic charge use capacitors or use a half-switch discharge circuit. Compensation capacitors only move the charge injection curve so that it is at its minimum at the midpoint of the signal range, and the charge injection is symmetrical about this point. Compensation capacitors do not affect the absolute value of the charge injected at the extremes of the signal range; they simply offset the charge injection curve. Using compensation capacitor also obviously adds capacitance, which affects bandwidth, overall circuit impedance and the like. The half switch discharge circuit is effective but it is costly in terms of die area. For low on-resistance switches, it is not an option as the size of the half switch is excessive and prohibitive. There is also a capacitive penalty with this solution.

DETAILED DESCRIPTION

Embodiments of the present invention relate to a charge injection discharge circuit and method. An exemplary charge injection discharge circuit includes a pulse generating circuit, a charge injecting circuit, and a secondary switch. The pulsed generating circuit can have an input for a control signal and an output for output of a pulsed signal in response to the control signal. The pulsed generating circuit can include a circuit outputting a pulsed signal having a predetermined value and predetermined duration based on receipt of the control signal. The charge injecting circuit can have a main switch provided at an input to the charge injecting circuit. The charge injecting circuit can have ON and OFF states corresponding to the control signal input to the pulse generating circuit. The secondary switch can be configured to be actuated by the pulsed signal output by the pulse generating circuit during an OFF state of the charge injecting circuit, and an output of the charge injection circuit can be connected to an input of the secondary switch. The charge injection discharge circuit can include a voltage dividing circuit connected to an output of the secondary switch for reducing the voltage value at the input of the secondary switch to a substantially predetermined value.

Also disclosed is a circuit for dissipating injected parasitic charge including a circuit stage, a pulse generating circuit and a switch. The circuit stage having an input node and an output node that injects a parasitic charge when switched OFF to the output node. The pulse generating circuit can generate a pulsed signal having an input for receiving a control signal. The control signal indicates the circuit stage is switching OFF, and has an output for outputting a pulsed signal in response to the control signal at the input. The pulsed signal can have a predetermined duration. The switch can be configured to be actuated by the pulsed signal output by the pulse generating circuit, and having a terminal connected to the output node of the circuit stage and a terminal connected to a discharge circuit to dissipate the injected parasitic charge.

Also disclosed is a method for discharging a parasitic charge injected in a circuit. In response to receiving a control signal, a first switch is opened that generates a parasitic charge at a first node of the circuit, and a pulsed signal is generated by a pulse generating circuit. The pulsed signal can have a pulse lasting a predetermined duration. In response to receiving the pulsed signal, a second switch can be closed for the duration of the pulsed signal and discharges the parasitic charge injected at the first node.

Figure 1:
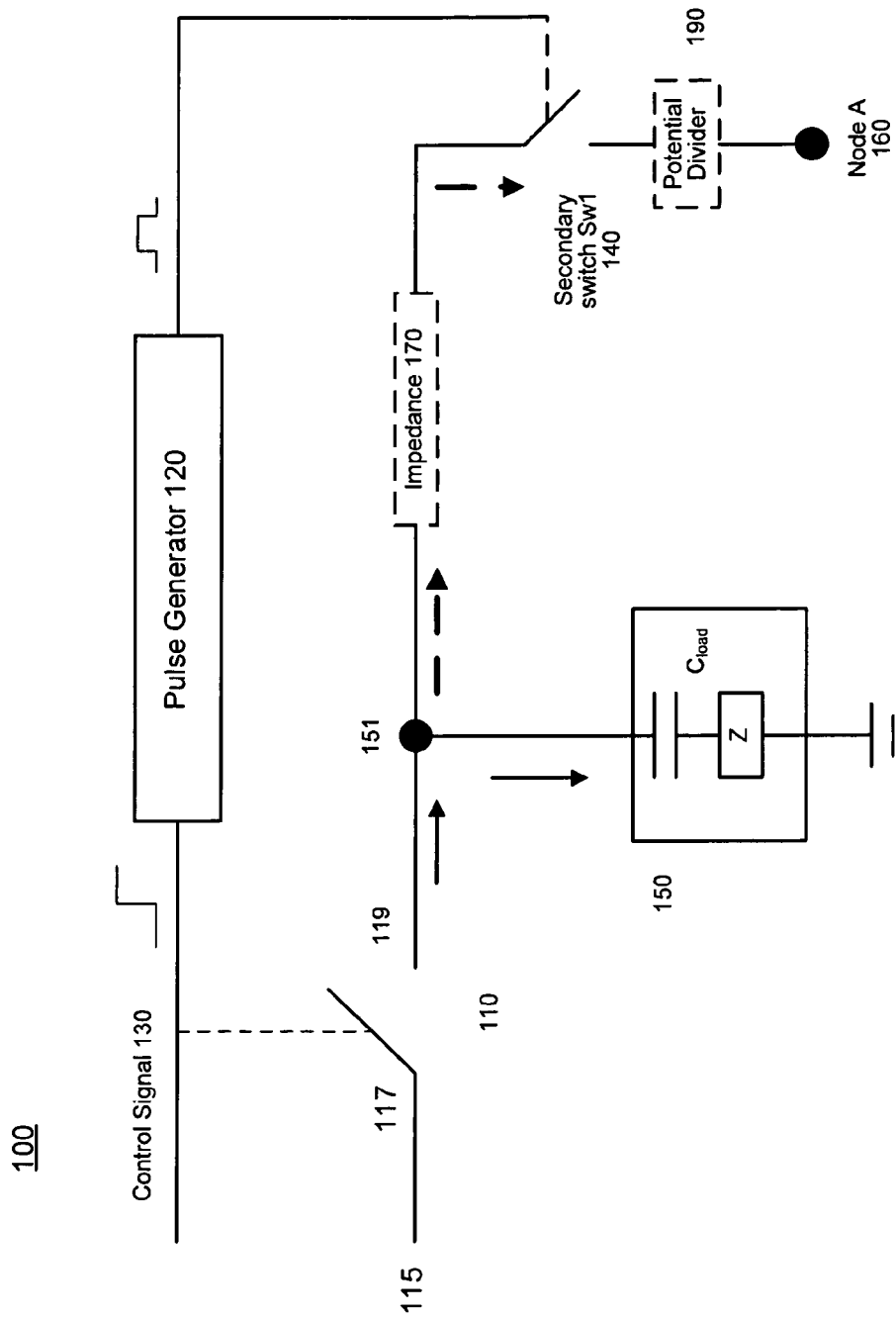
FIG. 1 illustrates a block diagram of a charge injection discharge circuit according to an embodiment of the present invention.

FIG. 1 illustrates a charge injection discharge circuit according to an exemplary embodiment of the present invention. The charge injection discharge circuit 100 may include a main switch 110, a pulse generator 120, a secondary switch 140, and an output to a load 150. The charge injection discharge circuit 100 can also include impedance 170 and a potential divider 190 that maintains an intermediate node) node A 160) at a predetermined potential. As illustrated in FIG. 1, main switch 110 can comprise a switch input 115, a switch output 119, and an switch control 117. A source voltage is applied to switch input 115. When the main switch 110 is closed, the source voltage appears at node 151 through switch output 119. An input to circuit 150 is connected to terminal 151. When main switch 110 is in the ON state (i.e., closed), current flows through the main switch 110 and to circuit 150 (over the current path shown by the dark arrows). Also connected to terminal 151 is secondary switch 140 as well impedance 170 or potential divider 190. When closed, secondary switch 140 completes a discharge current path from terminal 151 through impedance 170 or potential divider 190 to node A 160. Node A 160 can be ground. The actuation of secondary switch 140 is controlled by a pulse signal output from pulse generator 120 that is received at an input of switch 140. Pulse generator 120 is controlled by a control signal 130 that is received at an input of the pulse generator 120. Control signal 130 can be the same signal that signals main switch 110 to turn OFF.

Main switch 110 can be a CMOS transistor or any type of switch or switching circuit that can generate a parasitic charge that is injected to an output of the switch. As explained above, the parasitic charge can be injected when the main switch 110 is switched OFF.

A source voltage, such as a maximum analog voltage Vmax, can be applied to switch input 115. The switch control 117 can switch main switch 110 ON or OFF. The switch control 117 operates in response to the control signal 130. As illustrated, when the control signal 130 goes high, switch control 117 opens main switch 110. When main switch 110 opens, unwanted parasitic charge is injected to the switch output 119 of main switch 110. The parasitic charge creates a voltage spike at output terminal 151, which can be the same as the voltage at switch output 119.

The amount of parasitic charge can be approximated from equation (1):

$$\pm \Delta V \cong Q_{inj}/C_{load}, \qquad (1)$$

where $\pm \Delta V$ is the difference between the desired voltage at the output terminal 151 and the actual output on the output terminal 151. The $+\Delta V$ represents the voltage that must be discharged to maintain the voltage at output terminal 151 within its specified range. The amount and sign of charge $Q_{inj}$ is a function of the value and sign of the voltage applied to the switch input 115. In other words, if the analog voltage applied to switch input 115 is −10 volts, the charge will have a negative corresponding value that can be derived from Equation (1), and conversely, a charge having a positive, but corresponding value if +10 volts is applied.

Circuit 150 can be an Analog-to-Digital converter or another type of circuit that can require a stable input voltage. To minimize the $+\Delta V$ at the output node 151, the pulse generating circuit 120 outputs a pulsed signal in response to the control signal 130. The control signal 130 indicating that the main switch 110 is being turned off. Although the control signal 130 is shown as a rising signal, it could, conversely, be a falling signal as one of ordinary skill in the art would appreciate. The pulse generator circuit 120 outputs a pulsed signal to the secondary switch 140 for a predetermined duration, such as approximately 50-200 nanoseconds. The duration of the pulsed signal can be designed to last as long as necessary to discharge the additional voltage ΔV caused by the injected charge. The pulse generator circuit 120 can be any circuit that produces a pulsed signal capable of actuating the secondary switch 140, and that has a response time sufficient to generate the pulsed signal at substantially the same time as the parasitic charge is being generated by the switching OFF of the main switch 110. The pulsed signal can be generated by the pulse generator anytime after the main switch turns OFF. The pulsed signal can be generated immediately after the main switch 110 switches OFF, and, in combination with the response time of the secondary switch 140, ensures that the ΔV caused by the injected charge on the output node 151 starts being discharging immediately.

Secondary switch 140 is configured to be actuated by the pulsed signal output by the pulse generator 120 during an OFF state of the main switch 110. The secondary switch 140 has an input connected to an output of the main switch 110. Design considerations for the secondary switch 140 include a sufficient response time to be actuated in response to both the application of the pulsed signal and removal of the pulsed signal, and a capability to respond to a positive and negative control signal.

When secondary switch 140 is closed, any parasitic charge that accumulated at terminal 151 can be discharged through impedance 170 and potential divider 190. The amount of charge (or voltage) discharged is proportional to the duration or width of the pulse signal produced by pulse generator 120 and the size of the series impedance 170. Alternatively, if the circuit is implemented using the potential divider 190, the voltage at Node A 160 can be established by placing the potential divider 190 between the voltage applied at the switch input 115 and ground. The voltage at terminal 151 can either be held at ground or pulled to a voltage needed for operation of the load. In this configuration, the potential at Node A 160 is preferably zero (0) volts. However implemented, a design consideration is to maintain the voltage at node 151 at substantially its specified voltage level, and reduce the voltage value of the injected charge to substantially zero (0) volts. Of course, there will be some optimal voltage range for the voltage at node 151. But the voltage requirements at node 151 will depend upon the requirements of the circuit connected to node 151. Circuits having specific input voltage requirements, such as an analog-to-digital converter circuit, can be connected to node 151.

It is also possible that impedance 170 or potential divider 190 can be a variable impedance that can vary as the voltage applied to switch input 115 varies. Alternatively, the pulse generator 120 can be tuned to output a variable pulsed signal based on the voltage applied to switch input 115. For example, as the voltage applied to switch input 115 increases, the control signal 130 can be varied to signal to pulse generator 120 that a pulsed signal of longer duration is needed to discharge the larger charge injected by the higher voltage at switch input 115. Yet another alternative is a combination of varying the impedance of 170 or 190 and varying the pulse signal output by the pulse generator 120. Although, the above exemplary embodiment has been described with reference to a main switch 110, it should be understood that main switch 110 can be a plurality of switches that inject charge into node 151.

Figure 2:
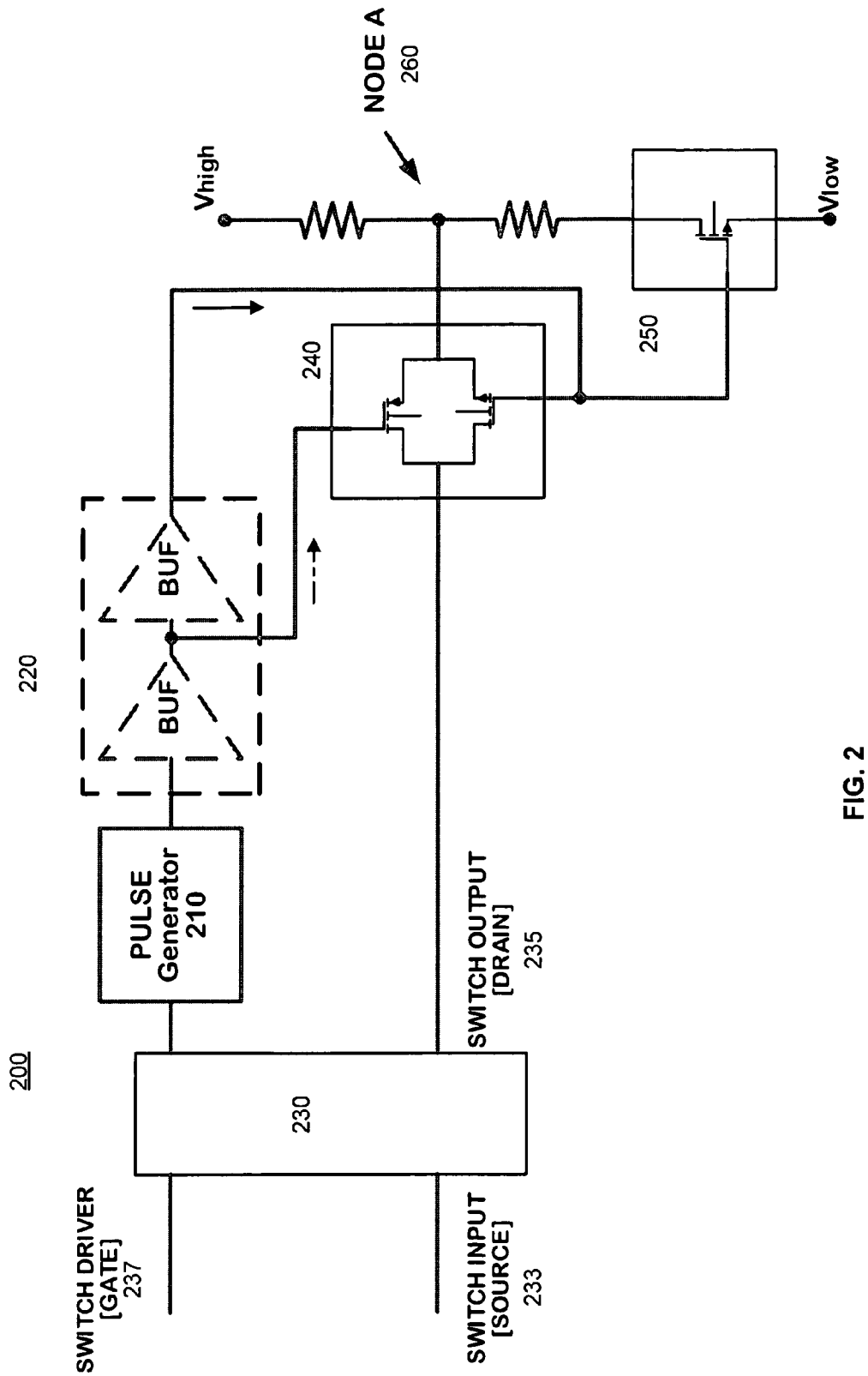
FIG. 2 illustrates a schematic of a charge injection discharge circuit according to another embodiment of the present invention.

FIG. 2 illustrates a schematic of a charge injection discharge circuit according to another embodiment of the present invention. The charge injection discharge circuit 200 can include a pulse generating circuit 210, buffers 220, a circuit stage 230, a secondary switch 240 and a potential divider circuit 250. The circuit stage 230, such as a CMOS transistor, can include a switch input node 233, such as a source of a CMOS transistor, and a switch output node 235, such as a drain of a CMOS transistor, and a switch driver 237, such as a gate signal of CMOS transistor. When the circuit stage 230 is implemented using a CMOS transistor, in the ON state, current passes from the switch input 233 (source) to switch output 235 (drain) as long as the appropriate voltage is applied to the switch driver 237 (gate). The circuit stage 230 is switched OFF when a voltage is no longer applied to the switch driver 237. When the circuit stage 230 is switched OFF, current no longer passes from switch input 233 to switch output 235, however, the circuit stage 230 injects a parasitic charge to the switch output 235. In response to the switch driver 237 signaling the circuit stage 230 to switch OFF, the pulse generating circuit 210 can generate a pulsed signal. The pulse generating circuit 210 can react to the OFF state of the switch driver 237 or a signal can be output to the pulse generating circuit 210 indicating that the switch driver 237 has a signal indicating the circuit stage 230 is to switch OFF.

The pulse generating circuit 210 has an output for outputting a pulsed signal in response to the control signal at its input. The pulsed signal can have a predetermined amplitude and duration. The predetermined amplitude and duration can be based on the amount of voltage to be discharged at node A 260. Node A 260 can be a node between the supply voltage $V_{high}$ and ground $V_{low}$, or some other potential. The pulsed signal actuates the secondary switch 240. The secondary switch 240 is configured to be actuated by the pulsed signal output by the pulse generator 210, and can have a terminal connected to the switch output 235 of the circuit stage 230. Another terminal of the secondary switch 240 is connected to potential divider circuit 250, such as resistor divider control, to dissipate the injected parasitic charge at switch output 235. The secondary switch 240 is only actuated (conducting) for the duration of the pulsed signal. When the pulsed signal is no longer applied to the secondary switch 240, the secondary switch 240 opens. When secondary switch 240 is conducting the potential at the switch output 235 is present at node A 260. As secondary switch 240 is conducting, potential divider circuit 250 also has a signal applied from the pulse generator 210 from the buffer 220, which causes potential divider circuit 250 to conduct. The potential value at node A 260 is divided over potential divider circuit 250 or over impedances present in the current path from $V_{high}$ to $V_{low}$. Buffers 220 can act as inverters or delay means (illustrated by the solid arrow) or otherwise provide some adjustment to the pulse signal output by the pulse generator 210. The secondary switch 240 can be a bi-directional switch or any switch suitable for performing the above described function.

Figure 3:
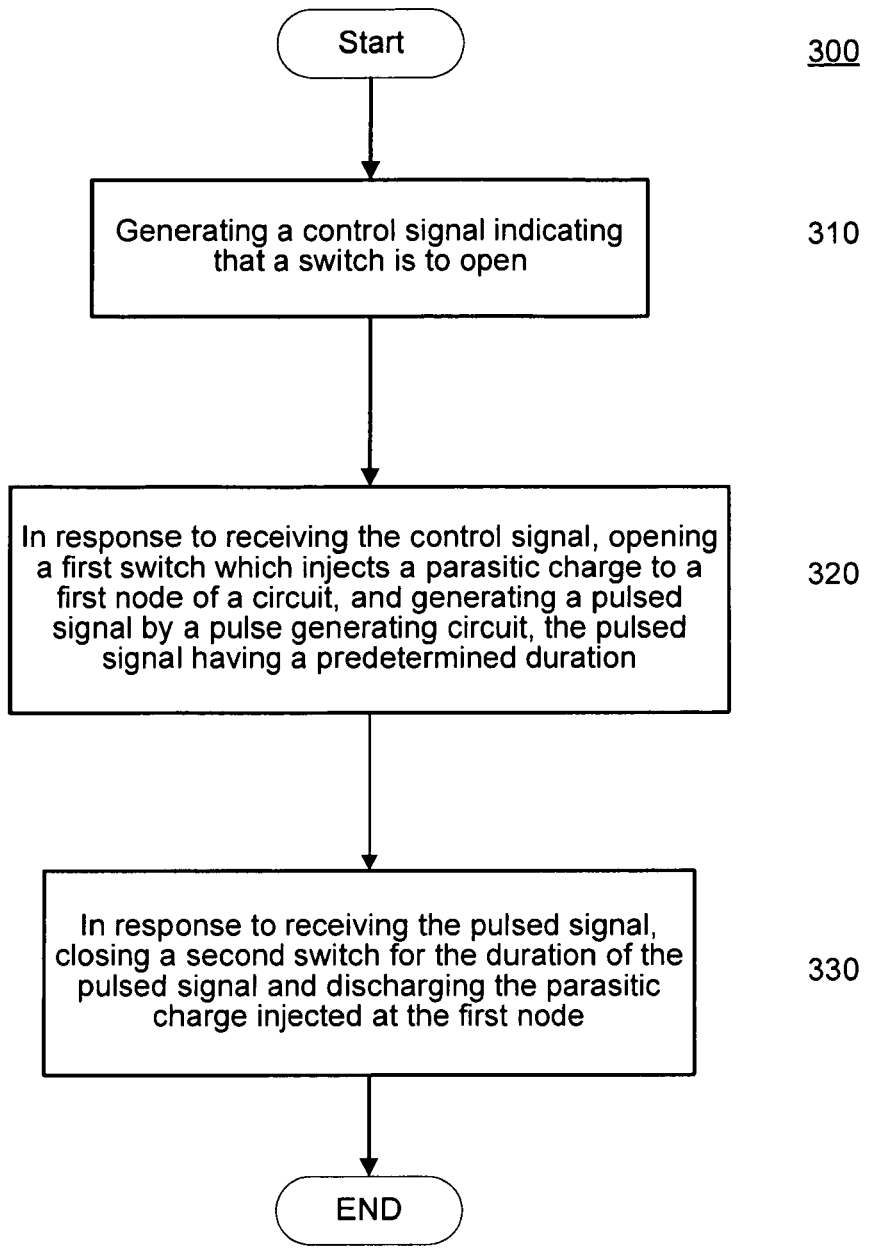
FIG. 3 illustrates a flowchart of a method implementing an exemplary embodiment of the present invention.

An exemplary flow of a process 300 for discharging a parasitic charge injected into a node of a circuit will be discussed with reference to FIG. 3. In step 310, a control signal is generated to indicate that a switch, such as a CMOS transistor, is to open. The control signal can directly control the switch that is to open or be a signal generated in response to the switch being signaled to open. In the case of a CMOS transistor, the CMOS transistor will open when gate voltage is no longer applied, or removed from, the gate of the CMOS transistor. In response to the removal of gate voltage, a control signal is generated and output to a pulse generating circuit. In response to receiving the control signal, the pulse generating circuit generates a pulsed signal having a predetermined duration (Step 320). The pulsed signal causes a second switch to actuate. The second switch is actuated for the predetermined duration of the pulse signal, and discharges the injected parasitic charge by connecting the node of the circuit to a discharge circuit (Step 330). The predetermined duration of the pulsed signal preferably has a duration long enough to substantially discharge the injected parasitic charge at the circuit node. The discharge circuit is designed to dissipate the voltage generated by the injected parasitic charge at the circuit node.

Those skilled in the art can appreciate from the foregoing description that the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A charge injection discharge circuit, comprising:
    a pulse generating circuit controlled by a control signal;
    a charge injecting circuit having an output node directly connected to a load and to provide an output voltage to the load, the charge injecting circuit being controlled by the control signal and generating a parasitic charge injected to the output node when switching off, wherein the pulse generating circuit generates a pulsed signal immediately after the control signal indicates the charge injecting circuit is switching from an ON state to an OFF state; and
    a secondary switch directly coupled to the output node of the charge injecting circuit, wherein the secondary switch is controlled by the pulsed signal to discharge the parasitic charge and to maintain an output voltage at the output node within a specified range.

2. The charge injection discharge circuit of claim 1, comprising:
    a voltage dividing circuit connected to an output of the secondary switch for reducing the voltage value at an input of the secondary switch to a predetermined value.

3. The charge injection discharge circuit of claim 2, further comprising:
    circuitry to tune the voltage dividing circuit connected to an output of the secondary switch for reducing the voltage value at the input of the secondary switch to a predetermined value based on a voltage applied to an input of the charge injecting circuit.

4. The charge injection discharge circuit of claim 1, the pulse generating circuit further comprising:
    a circuit outputting the pulsed signal having a predetermined value and predetermined duration based on receipt of the control signal.

5. The charge injection discharge circuit of claim 4, the pulse generating circuit configured to be tuned to output a variable pulsed signal based on a voltage applied to an input of the charge injecting circuit.

6. The charge injection discharge circuit of claim 1, the secondary switch further comprising a variable impedance configured to be tuned to reduce the voltage value at an input of the secondary switch to a predetermined value based on a voltage applied to an input of the charge injecting circuit.

7. A method for discharging a parasitic charge injected in a circuit, comprising:
    in response to receiving a control signal, opening a first switch to inject a parasitic charge into a first node of the first switch, the first node being directly coupled to a load to provide an output voltage to the load;
    generating a pulsed signal by a pulse generating circuit immediately after the control signal indicates the charge injecting circuit is switching from an ON state to an OFF state, the pulsed signal having a pulse lasting a predetermined duration to discharge the parasitic charge from the first node; and
    in response to receiving the pulsed signal, closing a second switch for the duration of the pulsed signal to discharge the parasitic charge and to maintain the output voltage at the first node within a specified range, the second switch being directly coupled to the first node.

8. The method of claim 7, comprising:
    generating the control signal based on a voltage applied to an input of the first switch.

* * * * *